(12) United States Patent
Nam

(10) Patent No.: US 9,478,296 B2
(45) Date of Patent: Oct. 25, 2016

(54) ERASE METHOD OF NONVOLATILE MEMORY DEVICE AND STORAGE DEVICE EMPLOYING THE SAME

(71) Applicant: Sang-Wan Nam, Hwaseong-Si (KR)

(72) Inventor: Sang-Wan Nam, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/501,361

(22) Filed: Sep. 30, 2014

(65) Prior Publication Data

US 2015/0179235 A1     Jun. 25, 2015

(30) Foreign Application Priority Data

Dec. 19, 2013    (KR) .................. 10-2013-0159559

(51) Int. Cl.
     *G11C 16/16*      (2006.01)
     *G11C 16/04*      (2006.01)
     *G11C 16/34*      (2006.01)

(52) U.S. Cl.
    CPC ........... *G11C 16/16* (2013.01); *G11C 16/0483* (2013.01); *G11C 16/3445* (2013.01)

(58) Field of Classification Search
    CPC ..................... G11C 16/3445; G11C 16/16
    USPC ................ 365/185.29, 218, 230.03
    See application file for complete search history.

(56) References Cited

U.S. PATENT DOCUMENTS

| | | | |
|---|---|---|---|
| 6,330,189 B1 * | 12/2001 | Sakui ................. | G11C 16/3454 365/185.17 |
| 7,372,733 B2 * | 5/2008 | Choi .................. | G11C 16/16 365/185.11 |
| 7,606,080 B2 | 10/2009 | Lee | |
| 7,630,255 B2 | 12/2009 | Yang | |
| 7,804,718 B2 | 9/2010 | Kim | |
| 8,023,327 B2 * | 9/2011 | Futatsuyama ....... | G11C 11/5642 365/185.17 |
| 8,467,246 B2 | 6/2013 | Kim et al. | |
| 8,514,624 B2 * | 8/2013 | Parat .................. | G11C 16/16 365/185.17 |
| 8,767,467 B2 * | 7/2014 | Parat .................. | G11C 16/16 365/185.17 |
| 8,867,271 B2 * | 10/2014 | Li ..................... | G11C 16/0483 365/185.02 |
| 8,929,148 B2 * | 1/2015 | Kim .................. | G11C 16/3445 365/185.22 |
| 8,966,330 B1 * | 2/2015 | Raghu ............... | G11C 16/10 714/721 |
| 9,064,598 B1 * | 6/2015 | Hirai ................. | G11C 16/3445 |

(Continued)

FOREIGN PATENT DOCUMENTS

JP      2007-250133 A     9/2007
KR    10-2006-0120889 A    11/2006

OTHER PUBLICATIONS

Soanes, Catherine, and Angus Stevenson. "Integrity." Concise Oxford English Dictionary. Oxford: Oxford UP, 2009. 738. Print.*

(Continued)

*Primary Examiner* — Hoai V Ho
*Assistant Examiner* — Roberto Mancera
(74) *Attorney, Agent, or Firm* — Volentine & Whitt, PLLC

(57) ABSTRACT

A method of erasing a nonvolatile memory device which includes a plurality of memory blocks includes receiving an erase command; erasing a selected memory block among the plurality of memory blocks in response to the erase command; and performing an operation of checking whether a threshold voltage of a selection transistor connected to at least one selection line for selecting strings included in the selected memory block is changed while performing an erase verification operation for checking whether the selected memory block is normally erased.

12 Claims, 16 Drawing Sheets

(56) References Cited

U.S. PATENT DOCUMENTS

| | | | | |
|---|---|---|---|---|
| 9,070,474 B2* | 6/2015 | Izumi | ............... | G11C 16/3445 |
| 2005/0041553 A1* | 2/2005 | Aizawa | ............ | G11C 16/0483 |
| | | | | 369/59.17 |
| 2009/0010071 A1 | 1/2009 | Lee | | |
| 2009/0287879 A1* | 11/2009 | Oh | ................ | G11C 16/0483 |
| | | | | 711/103 |
| 2009/0303799 A1* | 12/2009 | Nakamura | ........... | G11C 16/16 |
| | | | | 365/185.22 |
| 2012/0051143 A1 | 3/2012 | Yoon et al. | | |
| 2012/0155180 A1 | 6/2012 | Kawamura et al. | | |
| 2012/0206975 A1* | 8/2012 | Yang | ................ | G11C 16/16 |
| | | | | 365/185.22 |
| 2012/0257455 A1 | 10/2012 | Oh et al. | | |
| 2012/0327713 A1* | 12/2012 | Parat | ................ | G11C 16/16 |
| | | | | 365/185.17 |
| 2013/0016561 A1* | 1/2013 | Nam | ............... | H01L 27/11556 |
| | | | | 365/185.11 |
| 2013/0088921 A1 | 4/2013 | Nam et al. | | |
| 2013/0114341 A1* | 5/2013 | Hung | ................ | G11C 29/785 |
| | | | | 365/185.16 |
| 2013/0114345 A1* | 5/2013 | Lee | ................. | G11C 16/0483 |
| | | | | 365/185.22 |
| 2013/0322174 A1* | 12/2013 | Li | .................. | G11C 16/0483 |
| | | | | 365/185.09 |
| 2014/0085982 A1* | 3/2014 | Asaoka | ............. | G11C 16/06 |
| | | | | 365/185.17 |
| 2014/0226407 A1* | 8/2014 | Izumi | ............... | G11C 16/3445 |
| | | | | 365/185.17 |
| 2014/0289559 A1* | 9/2014 | Hashimoto | ........... | G11C 29/08 |
| | | | | 714/27 |
| 2015/0170749 A1* | 6/2015 | Park | .................. | G11C 16/14 |
| | | | | 365/185.05 |
| 2015/0178000 A1* | 6/2015 | Yoon | ................ | G06F 3/0619 |
| | | | | 711/103 |
| 2015/0186055 A1* | 7/2015 | Darragh | ............ | G06F 3/0616 |
| | | | | 711/103 |

OTHER PUBLICATIONS

"What Do the Different Flowchart Shapes Mean?" What Do the Different Flowchart Shapes Mean? RFF Electronics, 2010. Web. Mar. 31, 2016. <http://www.rff.com/flowchart_shapes.htm>.*

Agnes, Michael. "While." Webster's New World Dictionary. New York, NY: Pocket, 2003. 735. Print.*

"Operation." Merriam-Webster. Merriam-Webster, n.d. Web. Jan. 27, 2012. <http://www.merriam-webster.com/thesaurus/operation>.*

* cited by examiner

ERASE METHOD OF NONVOLATILE MEMORY DEVICE AND STORAGE DEVICE EMPLOYING THE SAME

CROSS-REFERENCE TO RELATED APPLICATIONS

This U.S. non-provisional patent application claims priority under 35 U.S.C. §119 to Korean Patent Application No. 10-2013-0159559 filed Dec. 19, 2013, the subject matter of which is hereby incorporated by reference.

BACKGROUND

The inventive concepts relate generally to an erase method of a nonvolatile memory device and to a storage device including the same.

Semiconductor memory devices may be divided into volatile semiconductor memory devices or nonvolatile semiconductor memory devices. Nonvolatile semiconductor memory devices may retain data stored therein even at power-off. Data stored in a nonvolatile semiconductor memory device may be permanent or reprogrammable, depending upon the fabrication technology used. Nonvolatile semiconductor memory devices may be used for user data, program, and microcode storage in a wide variety of applications in the computer, avionics, telecommunications, and consumer electronics industries.

SUMMARY

One aspect of embodiments of the inventive concept is directed to providing a method of erasing a nonvolatile memory device which includes a plurality of memory blocks. The method comprises: receiving an erase command; erasing a selected memory block among the memory blocks in response to the erase command; and performing an operation of checking whether a threshold voltage of a selection transistor connected to at least one selection line for selecting strings included in the selected memory block is changed while performing an erase verification operation for checking whether the selected memory block is normally erased.

Another aspect of embodiments of the inventive concept is directed to providing a storage device comprising at least one nonvolatile memory device including a plurality of memory blocks each having a plurality of strings connected to a bit line, each of the strings having at least one string selection line, a plurality of memory cells, and at least one of a string selection transistor and a ground selection transistor; and a memory controller configured to control the at least one nonvolatile memory device, wherein the memory controller comprises a bad mark management unit configured to control the at least one nonvolatile memory device to check whether a threshold voltage of the at least one of the string selection transistor and one ground selection transistor of a selected memory block among the plurality of memory blocks is changed, while performing an erase procedure for the selected one of the memory blocks, to assign a bad mark for the selected memory block according to a result of the checking, and to store the bad mark in an assigned area of the at least one nonvolatile memory device.

Yet another aspect of embodiments of the inventive concept is directed to providing a method of operating a nonvolatile memory device which includes a plurality of memory blocks. The method comprises: receiving at a nonvolatile memory device a command for the nonvolatile memory device to perform an operation on a selected memory block among the plurality of memory blocks; and in response to the command, performing an operation of checking whether a threshold voltage of a selection transistor connected to at least one selection line for selecting strings included in the selected memory block is changed.

With embodiments of the inventive concept, it is possible to improve reliability of data by performing an operation of checking a threshold voltage of a selection transistor connected to a selection line at an erase operation.

BRIEF DESCRIPTION OF THE FIGURES

Examples of certain embodiments of the inventive concept are illustrated in the accompanying drawings.

DETAILED DESCRIPTION

Figure 1:
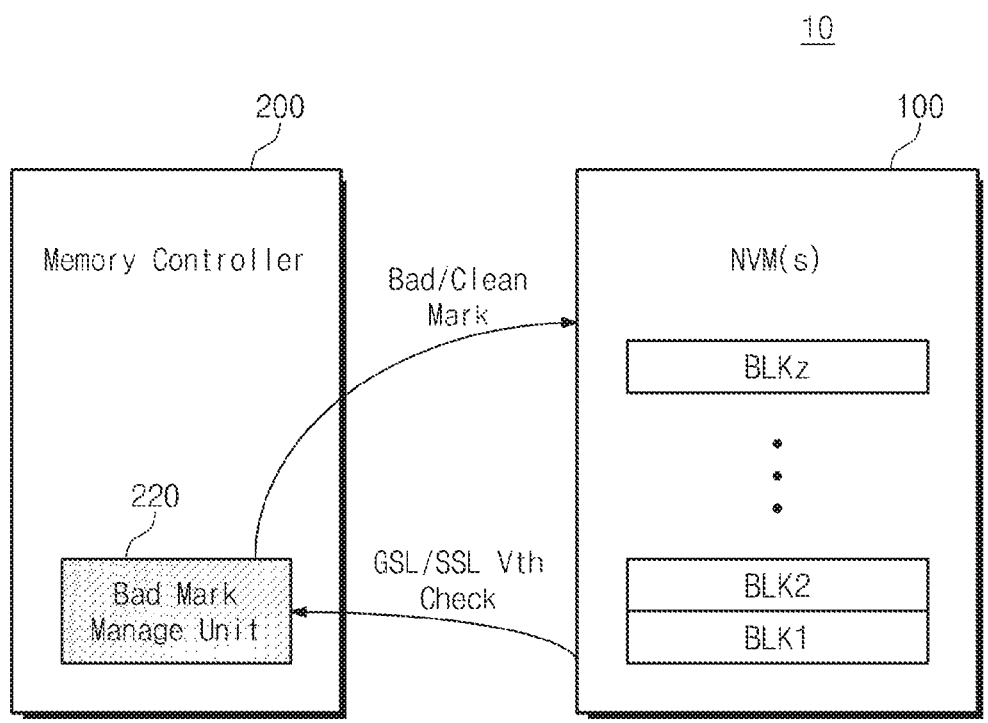
FIG. 1 illustrates a storage device.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a storage device 10. Storage device 10 includes at least one nonvolatile memory device 100 and a memory controller 200 to control the at least one nonvolatile memory device 100.

Nonvolatile memory device 100 may be a NAND flash memory, a vertical NAND flash memory (VNAND), a NOR flash memory, a resistive RAM (RRAM), a phase-change RAM (PRAM), a magnetoresistive RAM (MRAM), an STT-RAM (Spin Transfer Torque Random Access Memory), etc. Also, nonvolatile memory device 100 may be implemented to have a three-dimensional array structure. The inventive concept may be applied not only to a flash memory device where a charge storage layer is formed of a floating gate, but also a charge trap flash (CTF) memory where a charge storage layer is formed of an insulation film. Below, it is assumed that nonvolatile memory device 100 is a vertical NAND flash memory device.

Nonvolatile memory device 100 includes a plurality of memory blocks BLK1 to BLKz (z being an integer of 2 or more).

Memory controller 200 includes a bad mark management unit 220 that may check whether a threshold voltage of a selection transistor connected to at least one selection line GSL and/or SSL (refer to FIG. 2) of each memory block is varied, and which assigns (sets/decides/directs) a bad mark or a clean mark to a corresponding memory block according to the checking result. Here, clean/bad mark information may be stored in a predetermined area of nonvolatile memory device 100.

In exemplary embodiments, a threshold voltage of a selection transistor connected to a selection line GSL/SSL is checked during one of programming, read, and erase operations of nonvolatile memory device 100.

In exemplary embodiments, when the checking result indicates that a threshold voltage of a selection transistor connected to a selection line GSL/SSL is varied, the programming, read, or erase operation is performed after a threshold voltage of the selection transistor is adjusted.

In exemplary embodiments, when the checking result indicates that a threshold voltage of a selection transistor connected to a selection line GSL/SSL is varied, a bad mark is instantly assigned to a corresponding memory block.

In other exemplary embodiments, when the checking result indicates that a threshold voltage of a selection transistor connected to a selection line GSL/SSL is varied, the programming, read, or erase operation is once performed after a threshold voltage of the selection transistor is adjusted. Afterwards, a bad mark is assigned to a corresponding memory block.

In other exemplary embodiments, an operation of checking a threshold voltage of the selection transistor connected to the selection line GSL/SSL is optionally performed based on a request of memory controller 200 generated according to environmental information pertaining to storage device 10. Here, the environmental information pertaining to storage device 10 may be a temperature of storage device 10, a data input/output error rate, the number of operations associated with programming, erasing or reading, etc. For example, memory controller 200 generates selection line checking information based on the environmental information, and nonvolatile memory device 100 may check a threshold voltage of the selection transistor connected to the selection line GSL/SSL based on selection line checking information. A timing of an operation of checking a threshold voltage of the selection transistor connected to the selection line GSL/SSL is processed using firmware.

Storage device 10 may prevent data from being damaged before degradation is generated by checking and managing whether a threshold voltage of the selection transistor connected to the selection line GSL/SSL is varied.

Figure 2:
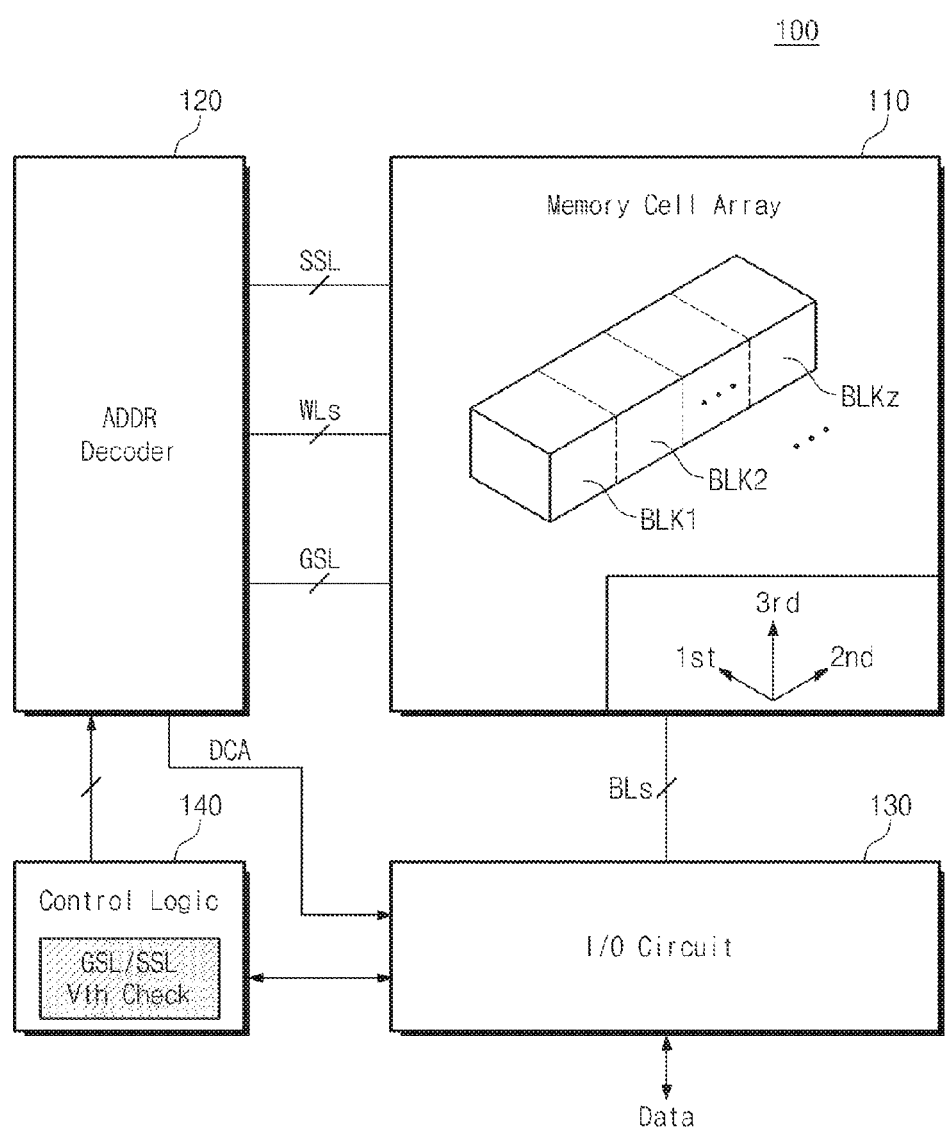
FIG. 2 is a block diagram schematically illustrating a nonvolatile memory device shown in FIG. 1.

FIG. 2 is a block diagram schematically illustrating nonvolatile memory device 100 shown in FIG. 1. Referring to FIG. 2, nonvolatile memory device 100 includes a memory cell array 110, an address decoder 120, an input/output circuit 130, and control logic 140.

Memory cell array 110 is connected to address decoder 120 through word lines WLs, at least one string selection line SSL, and at least one ground selection line GSL. Memory cell array 110 is connected to input/output circuit 130 through bit lines BLs. Memory cell array 110 includes a plurality of memory blocks BLK1 to BLKz (z being an integer of 2 or more).

Each of the memory blocks BLK1 to BLKz includes a plurality of strings that are arranged along a first direction and a second direction (being different from the first direction) and along a third direction (a direction perpendicular to a plane formed in the first and second directions) to have a three-dimensional structure. Here, each string may include at least one string selection transistor, a plurality of memory cells, and at least one ground selection transistor stacked on a substrate. Each memory cell may store at least one data bit. In exemplary embodiments, at least one dummy cell may be included between the at least one string selection transistor and the memory cells. In other exemplary embodiments, at least one dummy cell may be included between the memory cells and the at least one ground selection transistor.

Address decoder 120 selects one of the memory blocks BLK1 to BLKz based on an input address. Address decoder 120 is connected to the selected memory block through the word lines WLs, the at least one string selection line SSL, and the at least one ground selection line GSL. Address decoder 120 selects the word lines WLs, the string selection line SSL, and the ground selection line GSL using a decoded row address.

Also, address decoder 120 decodes a column address of the input address ADDR. The decoded column address DCA is provided to input/output circuit 130. In exemplary embodiments, address decoder 120 may include a row decoder, a column decoder, an address buffer, and so on.

Input/output circuit 130 is connected to memory cell array 110 through the bit lines BLs. Input/output circuit 130 is configured to receive the decoded column address DCA from address decoder 120. Input/output circuit 130 selects the bit lines BLs using the decoded column address DCA.

Input/output circuit 130 receives data from an external device (e.g., a memory controller 200) and stores the received data in memory cell array 110. Input/output circuit 130 reads data from memory cell array 110 to output it to the external device. Meanwhile, input/output circuit 130 may read data from a first area of memory cell array 110 to store it in a second area of memory cell array 110. For example, input/output circuit 130 may be configured to perform a copy-back operation.

Control logic 140 controls an overall operation of nonvolatile memory device 100 including a programming operation, a read operation, an erase operation, etc. Control logic 140 operates in response to control signals or commands provided from the external device.

Control logic 140 controls internal components (e.g., address buffer 120, input/output circuit 130, and the like) to check whether threshold voltages of selection transistors GST/SST connected to a selection line GSL/SSL are changed.

In exemplary embodiments, during an erase procedure, control logic 140 may check whether a threshold voltage of a selection transistor connected to the selection line GSL/SSL is varied.

In exemplary embodiments, after receiving an erase command and before performing an erase operation, control logic 140 may check whether a threshold voltage of a selection transistor connected to the selection line GSL/SSL is varied. That is, the threshold voltage of a selection transistor other than memory cells is verified.

In other exemplary embodiments, when performing an erase verification operation after an erase operation is performed according to an erase command, control logic 140 may check whether a threshold voltage of a selection transistor connected to the selection line GSL/SSL is varied. In other words, a selection transistor and memory cells are verified at the same time.

Reliability of nonvolatile memory device 100 may be improved by checking, during an erase procedure, whether a threshold voltage of a selection transistor connected to the selection line GSL/SSL is varied. An operation of checking whether a threshold voltage of a selection transistor connected to the selection line GSL/SSL is varied is not limited to the erase procedure. For example, an operation of checking whether a threshold voltage of a selection transistor connected to the selection line GSL/SSL is varied is applicable to other procedures and operations including a programming operation, a read operation, etc.

Figure 3:
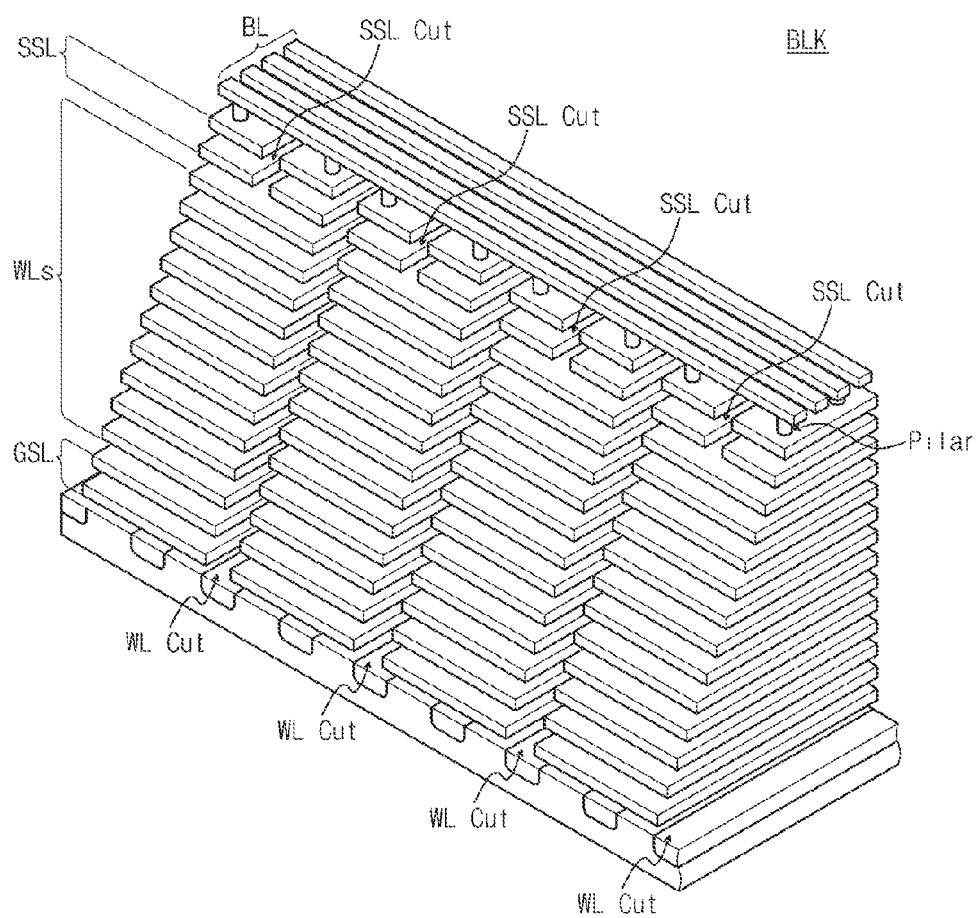
FIG. 3 is a perspective view of a memory block BLK shown in FIG. 1.

FIG. 3 is a perspective view of a memory block BLK shown in FIGS. 1 and 2. Referring to FIG. 3, four sub blocks are formed on a substrate. Each sub block is formed by stacking at least one ground selection line GSL, a plurality of word lines WLs, and at least one string selection line SSL on the substrate and between word line cuts (WL Cut) in a plate shape. Here, the at least one string selection line SSL in each sub block is split or divided by string selection line cuts (SSL Cut).

In exemplary embodiments, at least one plate-shaped dummy line is stacked between the ground selection line GSL and the word lines WLs. Or, at least one plate-shaped dummy line is stacked between the word lines WLs and the string selection line SSL.

Although not shown in FIG. 3, each word line cut WL Cut may include a common source line CSL. In exemplary embodiments, the common source lines CSL included in the word line cuts WL Cut may be interconnected. A string may be formed by making a pillar connected to a bit line penetrate the at least one string selection line SSL, the word lines, and the at least one ground selection line GSL.

In FIG. 3, there is illustrated an embodiment in which a structure between word line cuts WL Cut is a sub block. However, the inventive concept is not limited thereto. For example, a structure between a word line cut WL Cut and a string selection line cut SSL Cut may be defined as a sub block.

The memory block BLK may be implemented to have a merged word line structure where two word lines are merged to one.

Figure 4:
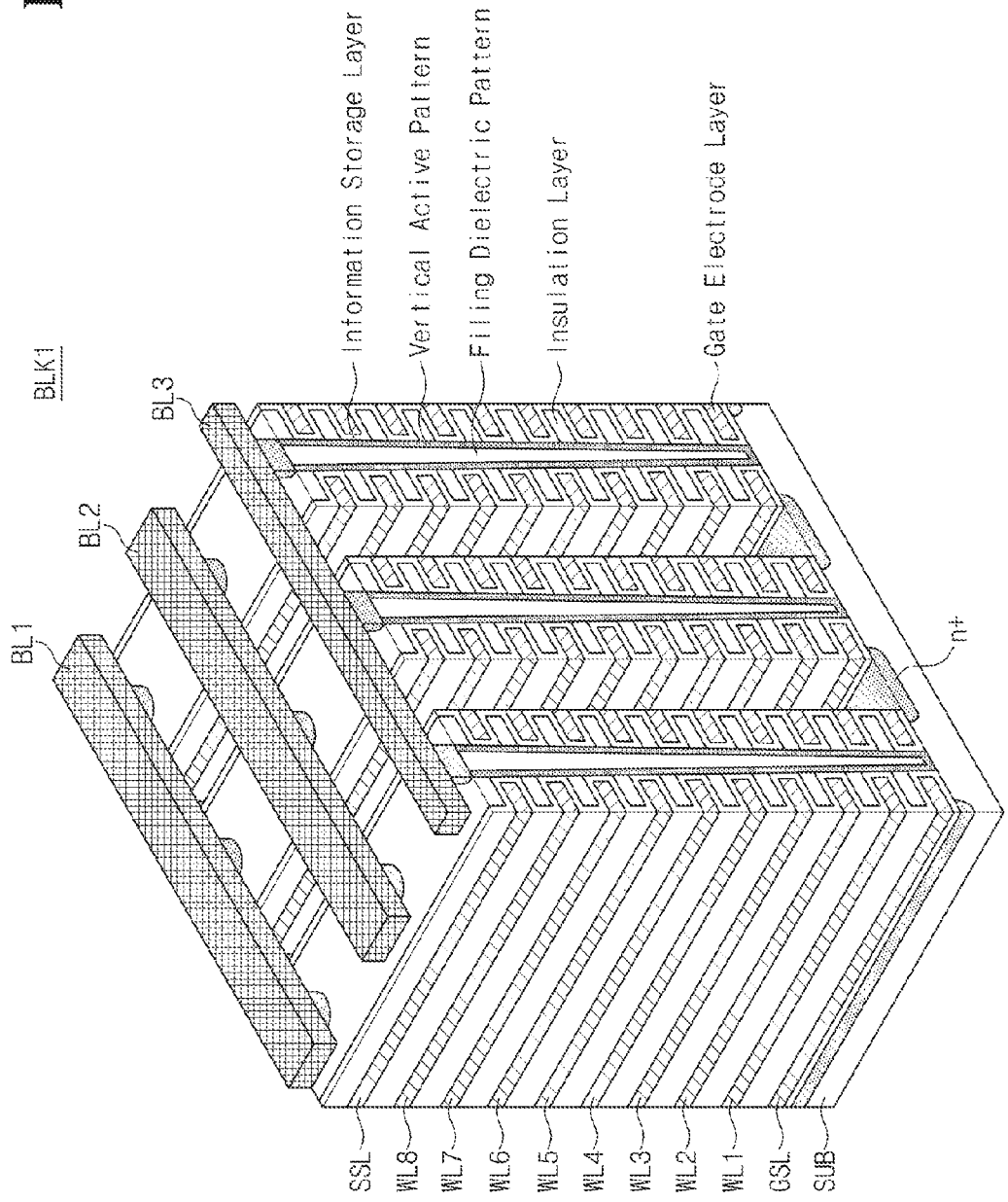
FIG. 4 is a perspective view schematically illustrating a memory block.

FIG. 4 is a perspective view schematically illustrating a memory block BLK1. Referring to FIG. 4, a memory block BLK1 is formed in a direction perpendicular to a substrate SUB. An n+ doping region is formed in the substrate SUB.

A gate electrode layer and an insulation layer are deposited on the substrate SUB in turn. An information storage layer is formed between the gate electrode layer and the insulation layer.

If the gate electrode layer and the insulation layer are patterned in a vertical direction, a V-shaped pillar is formed. The pillar is connected to the substrate SUB through the gate electrode layer and the insulation layer. An outer portion of the pillar may be formed of channel semiconductor as a vertical active pattern, and an inner portion thereof may be formed of an insulation material such as silicon oxide as a filing dielectric pattern.

The gate electrode layer of the memory block BLK1 is connected to a ground selection line GSL, a plurality of word lines WL1 to WL8, and a string selection line SSL. The pillars of the memory block BLK1 are connected to a plurality of bit lines BL1 to BL3. In FIG. 4, there is illustrated an example where one memory block BLK1 has two selection lines SSL and GSL, eight word lines WL1 to WL8, and three bit lines BL1 to BL3. However, the inventive concept is not limited thereto.

Figure 5:
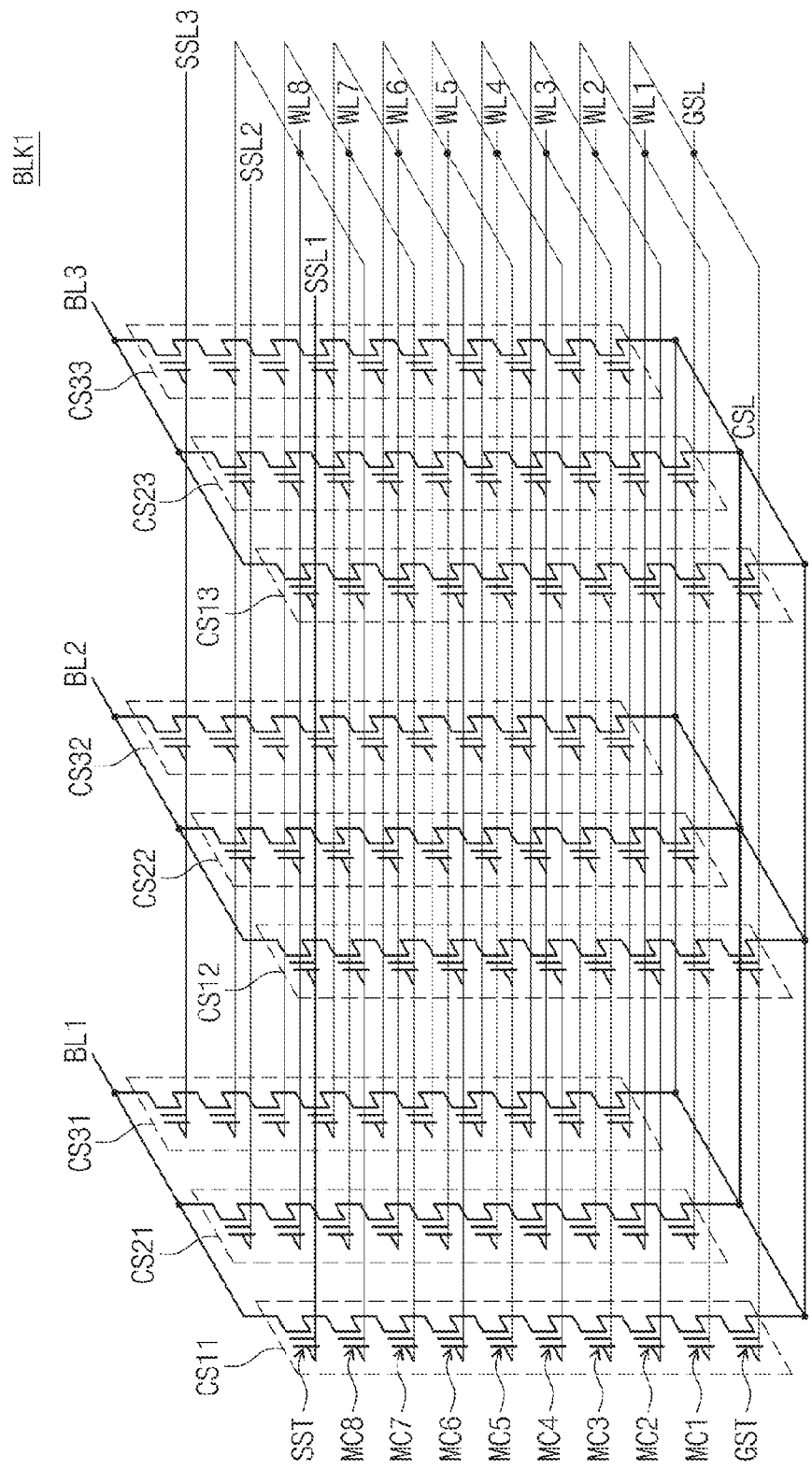
FIG. 5 is a circuit diagram schematically illustrating an equivalent circuit of a memory block shown in FIG. 4.

FIG. 5 is a circuit diagram schematically illustrating an equivalent circuit of a memory block BLK1 shown in FIG. 4. Referring to FIG. 5, cell strings CS11 to CS33 may be connected between bit lines BL1 to BL3 and a common source line CSL. Each cell string (e.g., CS11) includes a string selection transistor SST, a plurality of memory cells MC1 to MC8, and a ground selection transistor GST.

The string selection transistors SST are connected to a string selection line SSL. The string selection line SSL is divided into first to third string selection lines SSL1 to SSL3. The ground selection transistors GST are connected to a ground selection line GSL. In each cell string, the string selection transistor SST is connected to a bit line, and the ground selection transistor GST is connected to the common source line CSL.

In each string, the memory cells MC1 to MC8 are connected to word lines WL1 to WL8. A set of memory cells that are connected to a word line and are simultaneously programmed is referred to as a page. The memory block BLK1 includes a plurality of pages. Also, a word line is connected to a plurality of pages. Referring to FIG. 5, a word line with the same height (e.g., WL4) from the common source line CSL is connected in common to three pages.

Each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In a 2-bit MLC, two pages of data may be stored in a physical page. Thus, six pages of data may be stored at memory cells connected to a word line WL4.

A nonvolatile memory device may be implemented with a charge trap flash (CTF). In this case, there may be generated such an initial verify shift (IVS) phenomenon that charges trapped in a programmed CTF are redistributed and leaked over time. Reprogramming may be performed to overcome such distribution deterioration.

Figure 6:
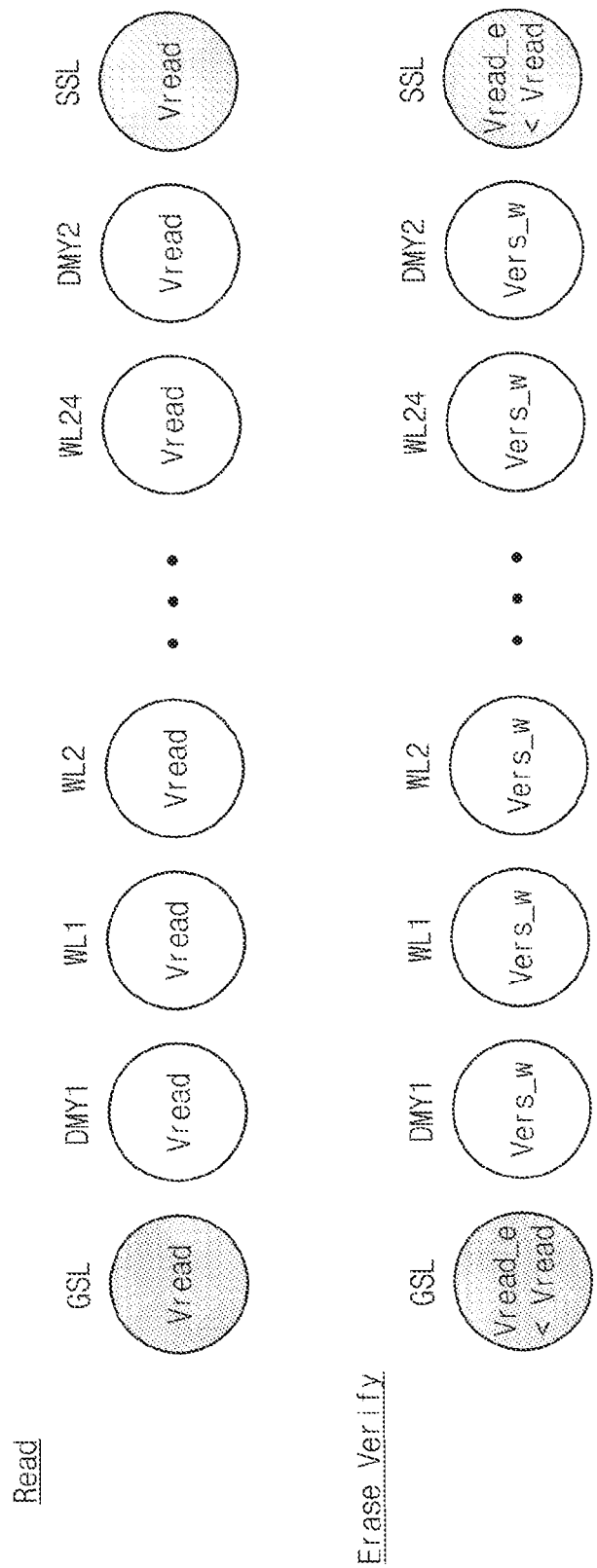
FIG. 6 is a diagram for describing checking a threshold voltage of a selection transistor connected to a selection line at the same time as an erase verification operation.

FIG. 6 is a diagram for describing checking a threshold voltage of a selection transistor connected to a selection line at the same time with an erase verification operation. For ease of description, in FIG. 6, there is illustrated an example where a ground selection line GSL, a first dummy word line DMY1, word lines WL1 to WL24, a second dummy word line DMY2, and a string selection line SSL associated with a selected string exist. Meanwhile, the number of word lines, the number of dummy word lines, the presence or absence of dummy word lines, the number of ground selection lines GSL, and the number of string selection lines SSL are not limited to an example shown in FIG. 6.

Referring to FIG. 6, an operation of checking a threshold voltage of a selection transistor connected to a selection line by applying an erase verification pass voltage Vread_e to a ground selection line GSL and a string selection line SSL is performed at the same time with an erase verification operation. At this time, an erase word line voltage Vers_w is applied to the dummy word lines DMY1 and DMY2 and to the word lines WL1 to WL24. Here, the erase word line voltage Vers_w is equal to or more than 0 V and is less than the erase verification pass voltage Vread_e.

In exemplary embodiments, the erase verification pass voltage Vread_e is less than a read pass voltage Vread applied in a read operation. As understood from FIG. 6, a bias for the erase verification operation is different from that for a read operation.

The erase verification operation according to an embodiment of the inventive concept illustrated in FIG. 6 does not use the read pass voltage Vread, which is used in the read operation. The erase verification operation is capable of checking whether or not a threshold voltage of a selection transistor connected to a selection line is changed, using the erase verification pass voltage Vread_e which is less than the read pass voltage Vread. Thus, it is possible to determine a degree of degradation or deterioration of a selection line GSL/SSL transistor at the same time as a main cell without consuming additional time.

Figure 7:
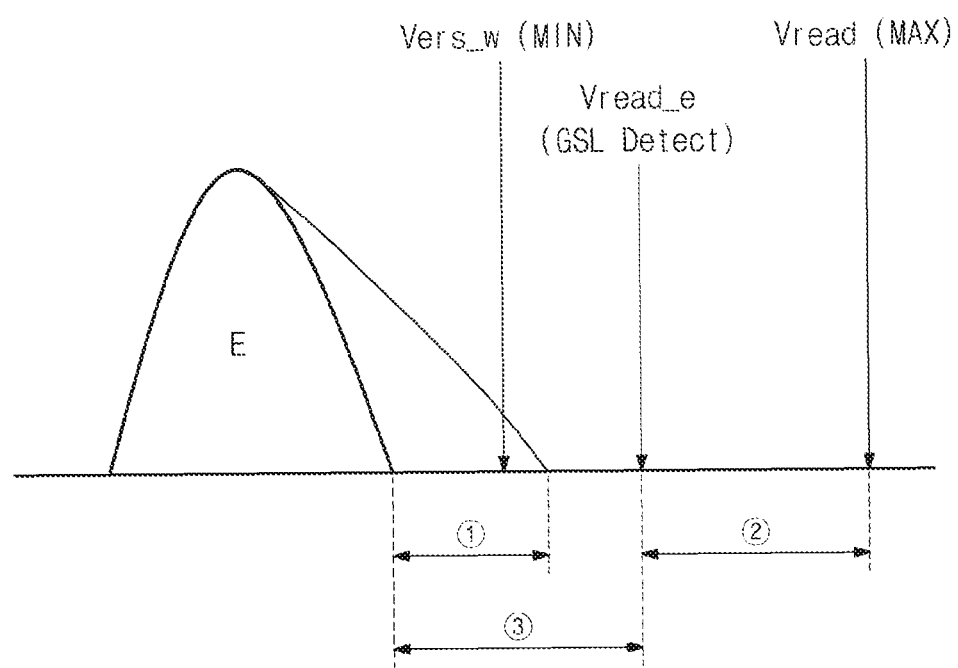
FIG. 7 is a diagram schematically illustrating a bias window for checking a threshold voltage of a selection transistor connected to a selection line in an erase verification operation.

FIG. 7 is a diagram schematically illustrating a bias window for checking a threshold voltage of a selection transistor connected to a selection line in an erase verification operation. Referring to FIG. 7, a bias window for checking a threshold voltage of a selection transistor connected to a selection line is defined by a minimum value Vers_w (e.g., a word line erase voltage) and a maximum value Vread (e.g., a read pass voltage). In FIG. 7, a first interval or period (①) is an interval or period wherein an erase cell E is deteriorated, a second interval or period (②) indicates a detection margin capable of deterioration of a ground selection line GSL, and a third interval or period (③) indicates a deterioration margin for the ground selection line GSL. Here, the second interval or period (②) is greater than the first period (①).

Meanwhile, a degree of deterioration of a memory cell is different from that of a ground selection transistor. For example, as illustrated in FIG. 7, a degree of deterioration (①) of a memory cell is less than that (②) of a ground selection transistor. The reason is that deterioration of a memory cell is associated with a shift of a center line on a plurality of memory cells and deterioration of the ground selection line is associated with a tail. Thus, different deterioration compensation (e.g., temperature and the like) may be applied to a memory cell and a ground selection line.

Figure 8:
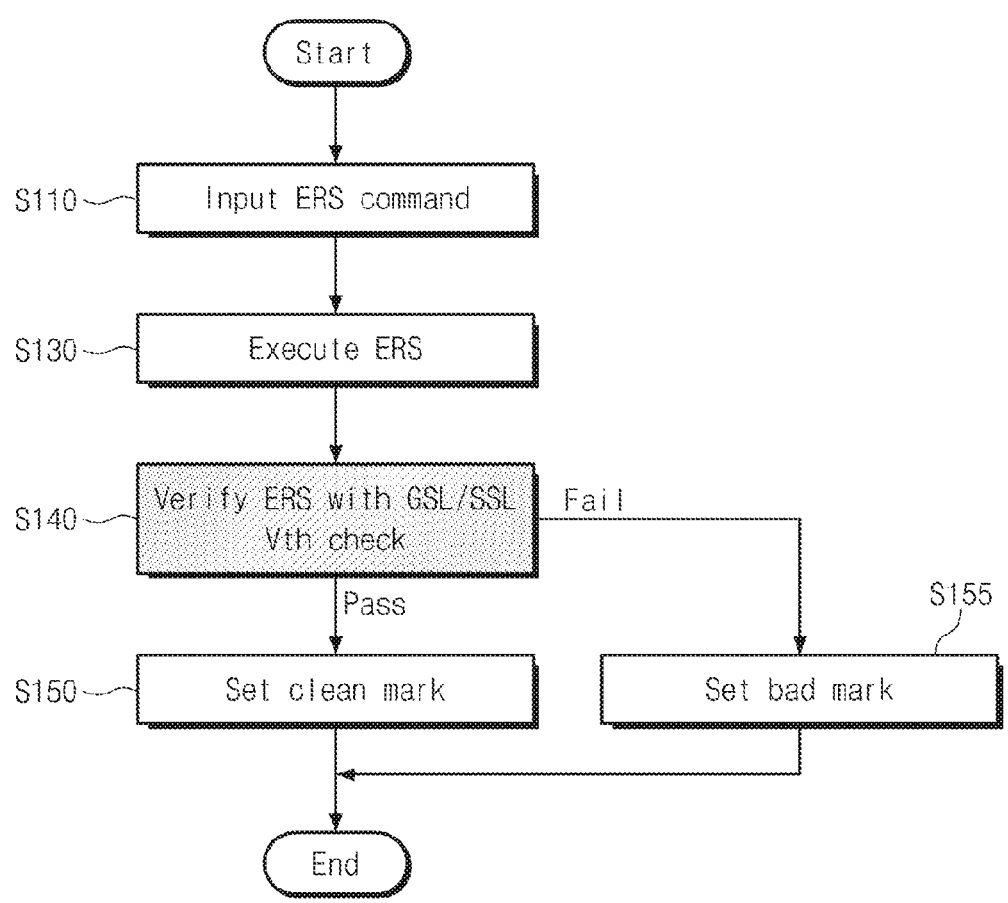
FIG. 8 is a flow chart schematically illustrating an erase procedure according to a first embodiment.

FIG. 8 is a flow chart schematically illustrating an erase procedure according to a first embodiment. An erase procedure will be more fully described with reference to FIGS. 6 to 8.

In step S110, an erase command for a memory block is provided to a nonvolatile memory device 100 (refer to FIG. 1). In step S130, the memory block is erased based on the erase command. In exemplary embodiments, the erase operation is performed using an ISPE (incremental step pulse erase) procedure. After the erase operation is executed at step S130, there is performed an erase verification operation for determining whether the erase operation is normally performed. In step S140, at the same time with an erase verification operation, there is performed an operation of checking a threshold voltage of a selection transistor connected to a selection line GSL/SSL. Here, the erase verification operation is performed substantially the same as described with reference to FIG. 6. As the erase operation is performed using the ISPE procedure, although the erase verification operation may fail, the erase operation is iterated when the number of erase loops is less than a defined maximum value.

If the erase verification operation passes in step 140, then in step S150 a clean mark is assigned for the erased memory block. In other exemplary embodiments, although the erase verification operation passes, a clean mark may not be assigned.

In contrast, if the erase verification operation fails, in step S155, a bad mark is assigned for the erased memory block. For example, a bad mark is assigned for a memory block when the number of erase loops exceeds a maximum value and the erase verification operation fails. Meanwhile, if the erase verification operation fails, a bad mark is instantly assigned. However, the inventive concept is not limited thereto. If the erase verification operation fails, a threshold voltage of a selection transistor may be adjusted to again perform an erase operation. If the erase verification operation following an erase operation again performed after adjustment of the threshold voltage of the selection transistor fails, a bad mark is assigned. The bad mark thus assigned is stored in a predetermined area of nonvolatile memory device 100. Afterwards, the erase procedure is ended.

Thus, in some embodiments an erase procedure may perform the erase verification operation, and an operation of checking whether a threshold voltage of a selection transistor connected to a selection line GSL/SSL is changed, at the same time.

In some embodiments, an operation of checking whether a threshold voltage of a selection transistor connected to a selection line GSL/SSL is changed may be performed before performing an erase operation.

Figure 9:
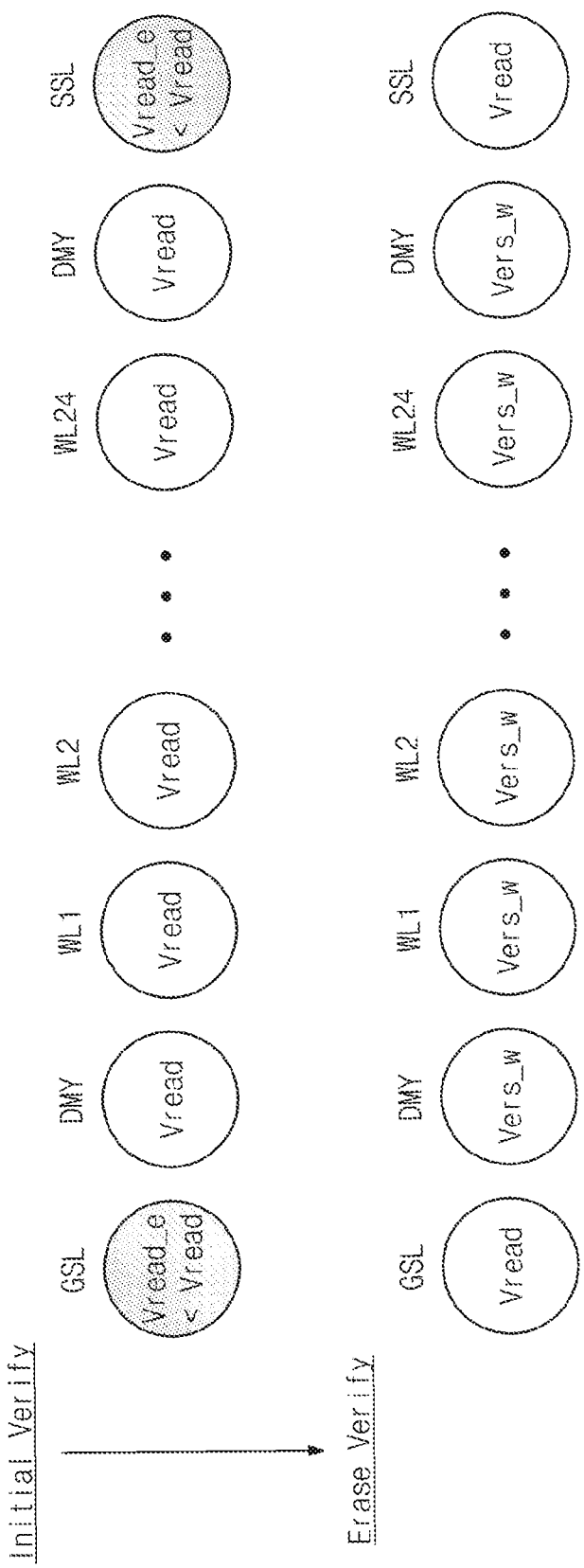
FIG. 9 is a diagram schematically illustrating an operation of checking a threshold voltage of a selection transistor connected to a selection line before an erase verification operation.

FIG. 9 is a diagram schematically illustrating an operation of checking a threshold voltage of a selection transistor connected to a selection line before an erase verification operation. Below, a threshold voltage checking operation performed before an erase operation is referred to as an initial verification operation. Referring to FIG. 9, the initial verification operation is performed by applying an erase verification pass voltage Vread_e to a ground selection line GSL and a string selection line SSL and a read pass voltage Vread to dummy word lines DMY1 and DMY2 and word lines WL1 to WL24, before the erase operation. The initial verification operation is used to check whether or not a threshold voltage of a selection transistor connected to a selection line GSL/SSL is changed. Afterwards, the erase operation is performed.

After the erase operation is executed, the erase verification operation is performed by applying the read pass voltage Vread to the ground selection line GSL and the string selection line GSL and an erase word line voltage Vers_w to the dummy word lines DMY1 and DMY2 and the word lines WL1 to WL24.

The erase procedure according to an embodiment of the inventive concept illustrated in FIG. 9 may perform the initial verification operation in which a threshold voltage of a selection transistor connected to a selection line GSL/SSL is checked.

Figure 10:
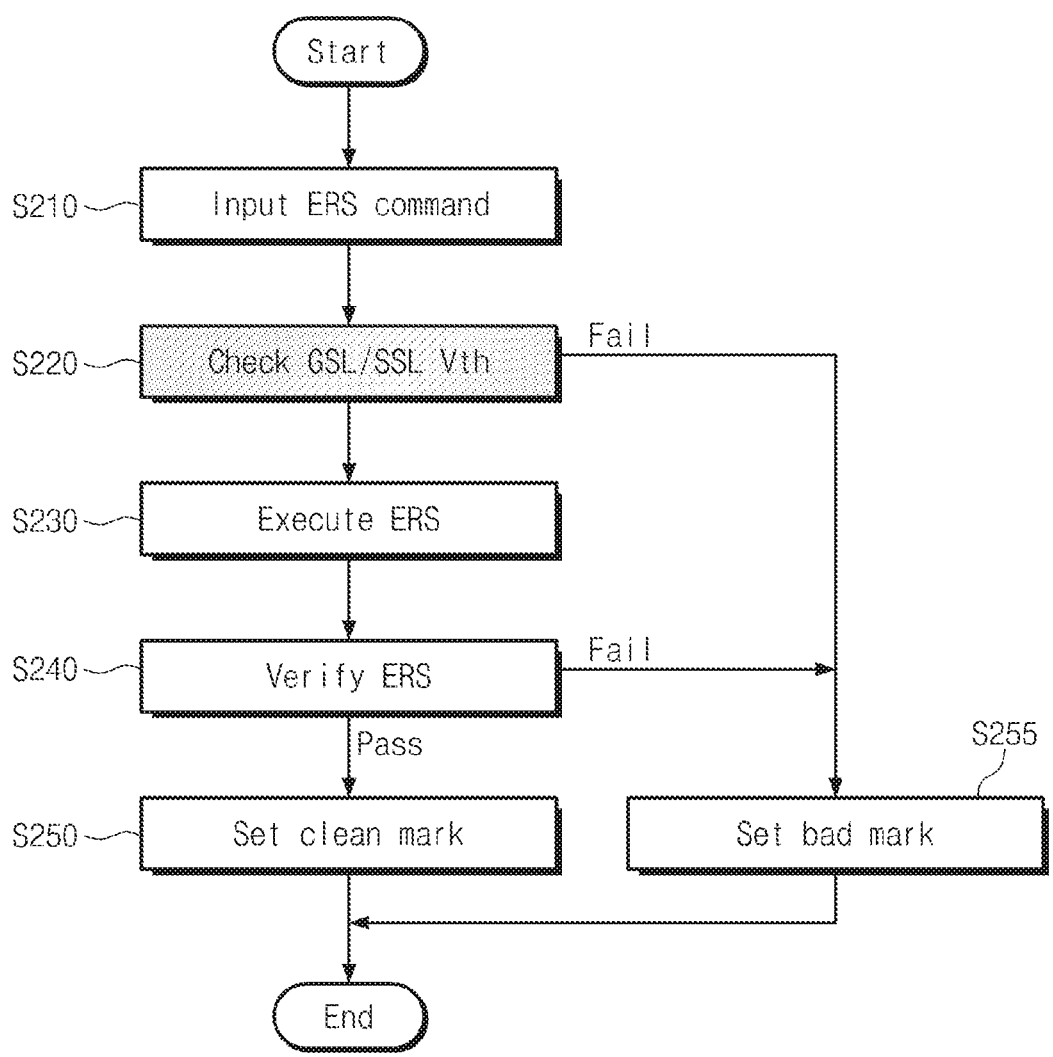
FIG. 10 is a flow chart schematically illustrating an erase procedure according to a second embodiment.

FIG. 10 is a flow chart schematically illustrating an erase procedure according to a second embodiment. An erase procedure will be more fully described with reference to FIGS. 9 to 10.

In step S210, an erase command for a memory block is provided to nonvolatile memory device 100 (refer to FIG. 1). In step S220, an operation of checking a threshold voltage of a selection transistor connected to a selection line GSL/SSL is performed. Here, an operation of checking a threshold voltage of a selection transistor connected to a selection line GSL/SSL is performed the same as an initial verification operation described with reference to FIG. 9. If a result of an operation of checking a threshold voltage of a selection transistor connected to a selection line GSL/SSL in step S220 indicates that the verification fails, in step S255 a corresponding memory block is assigned a bad mark. If the result indicates verification success, in step S230 the memory block is erased based on the erase command. Afterwards, there is performed an erase verification operation for determining whether the erase operation is normally performed. If the erase verification operation passes in step 240, then in step S250 a clean mark is assigned for the memory block. In contrast, if the erase verification operation fails, in step S255, a bad mark is assigned for the memory block. Afterwards, the erase procedure is ended.

Thus, in some embodiments an operation of checking whether a threshold voltage of a selection transistor connected to a selection line GSL/SSL is varied may be performed before performing an erase operation.

In some embodiments, an operation of checking a threshold voltage of a selection transistor connected to a selection line GSL/SSL may be performed before an erase operation, and also at the same time with an erase verification operation.

Figure 11:
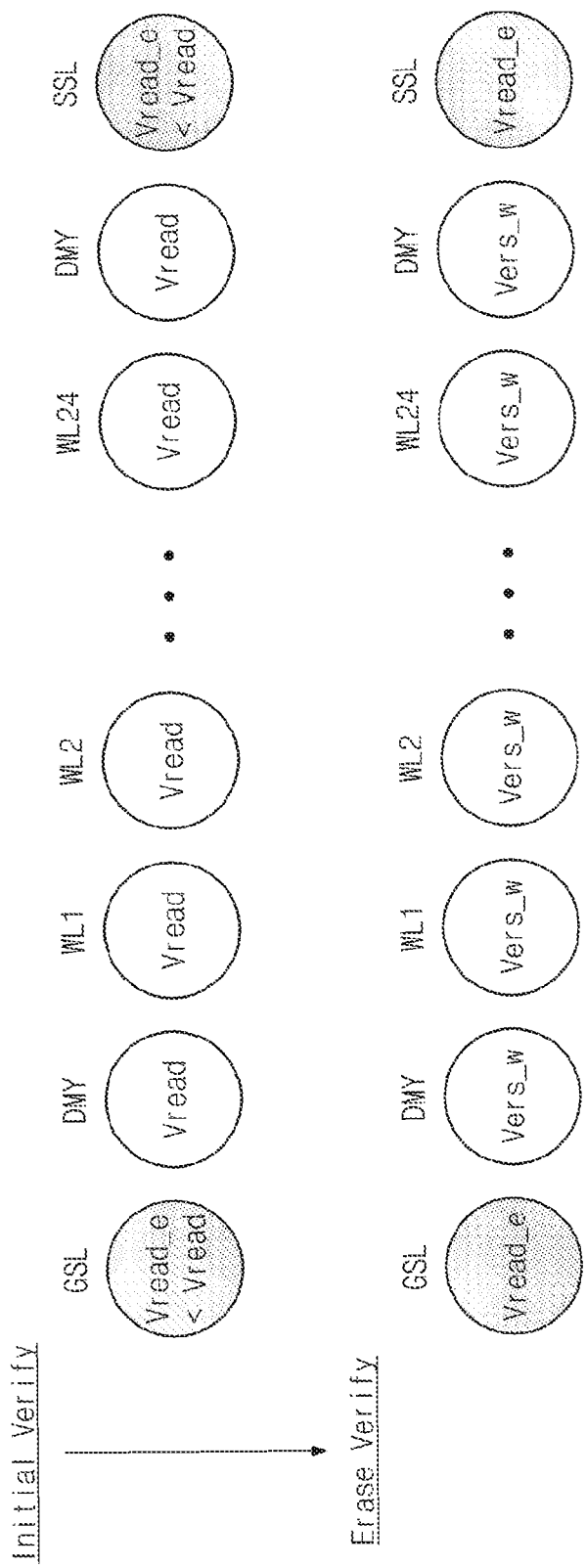
FIG. 11 is a diagram schematically illustrating an operation of checking a threshold voltage of a selection transistor connected to a selection line before an erase operation, and an operation of checking a threshold voltage of a selection transistor connected to a selection line at the same time as an erase verification operation.

FIG. 11 is a diagram schematically illustrating an operation of checking a threshold voltage of a selection transistor connected to a selection line before an erase operation, and an operation of checking a threshold voltage of a selection transistor connected to a selection line performed at the same time as an erase verification operation. Referring to FIG. 11, a bias condition of an erase operation is the same as that described with reference to FIG. 9 except an erase verification pass voltage Vread_e is applied to a ground selection line GSL and a string selection line SSL during an erase verification operation.

Thus in some embodiments, an operation of checking a threshold voltage of a selection transistor connected to a selection line GSL/SSL may be performed before an erase operation, and also at the same time as an erase verification operation.

Figure 12:
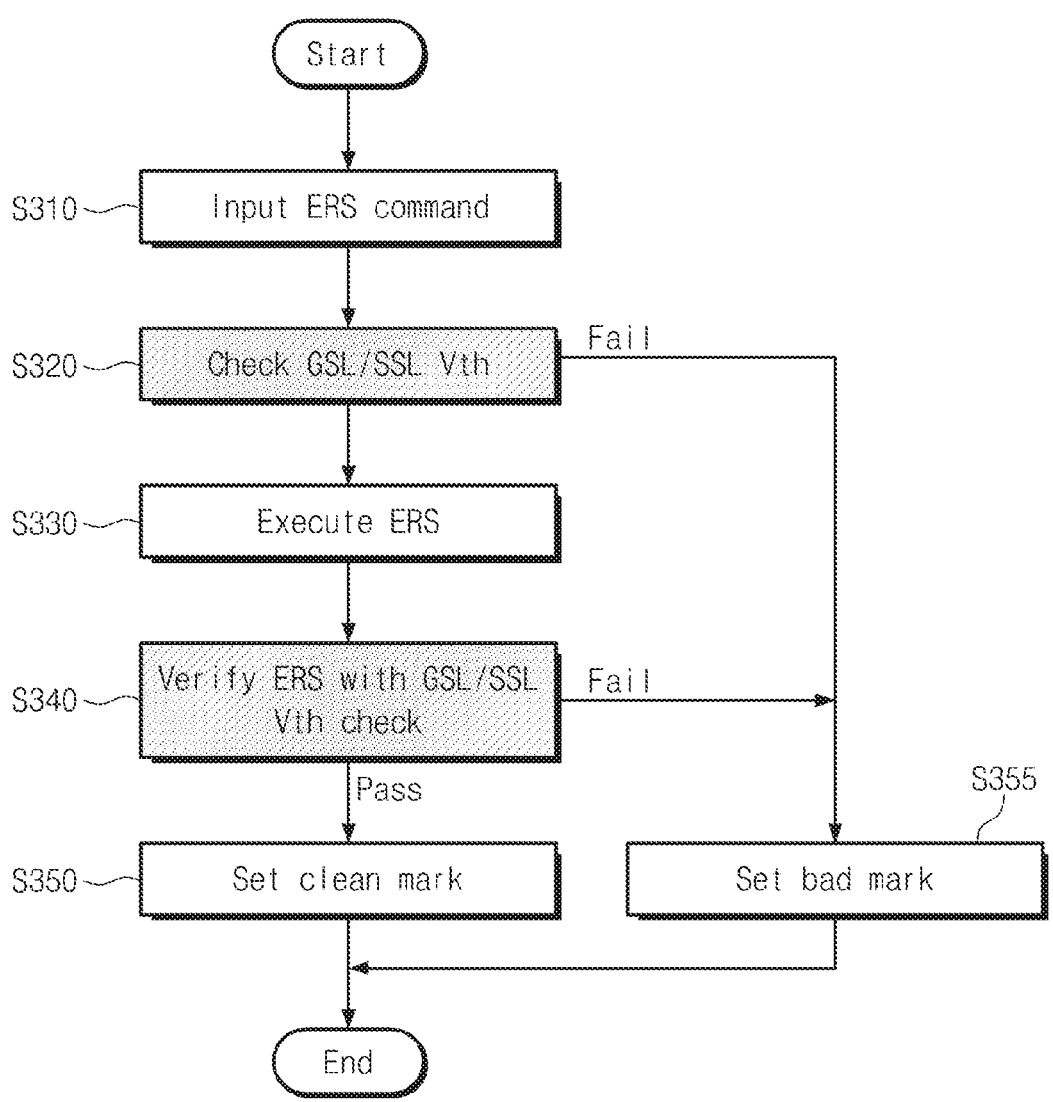
FIG. 12 is a flow chart schematically illustrating an erase procedure according to a third embodiment.

FIG. 12 is a flow chart schematically illustrating an erase procedure according to a third embodiment. An erase procedure will be more fully described with reference to FIGS. 11 to 12.

In step S310, an erase command for a memory block is provided to a nonvolatile memory device 100 (refer to FIG. 1). In step S320, an operation is performed of checking a threshold voltage of a selection transistor connected to a selection line GSL/SSL. Here, an operation of checking a threshold voltage of a selection transistor connected to a selection line GSL/SSL is performed the same as an initial verification operation described with reference to FIGS. 9 and 10. If a result of an operation of checking a threshold voltage of a selection transistor connected to a selection line GSL/SSL in step S320 indicates a verification fail, then in step S355 a corresponding memory block is assigned a bad mark. If the result in step S320 indicates verification success, then in step S330 the memory block is erased based on the erase command. Afterwards, an erase verification operation is performed for determining whether the erase operation is normally performed, and at the same time an operation is performed of checking a threshold voltage of a selection transistor connected to a selection line GSL/SSL. Here, the erase verification operation is performed the same as described with reference to FIGS. 6 and 8. If the erase verification operation in step S340 passes, then in step S350 a clean mark is assigned for the memory block. In contrast, if the erase verification operation fails in step S340, then in step S355 a bad mark is assigned for the memory block. Afterwards, the erase procedure is ended.

The erase operation illustrated in FIG. 12 may check whether or not a threshold voltage of a selection transistor connected to a selection line GSL/SSL is varied, before and after an erase operation.

Meanwhile, storage device 10 may be configured not to use a memory block with a bad mark. However, the inventive concept is not limited thereto. For example, storage device 10 may utilize a memory block with a bad mark by changing a bias condition for the memory block.

Figure 13:
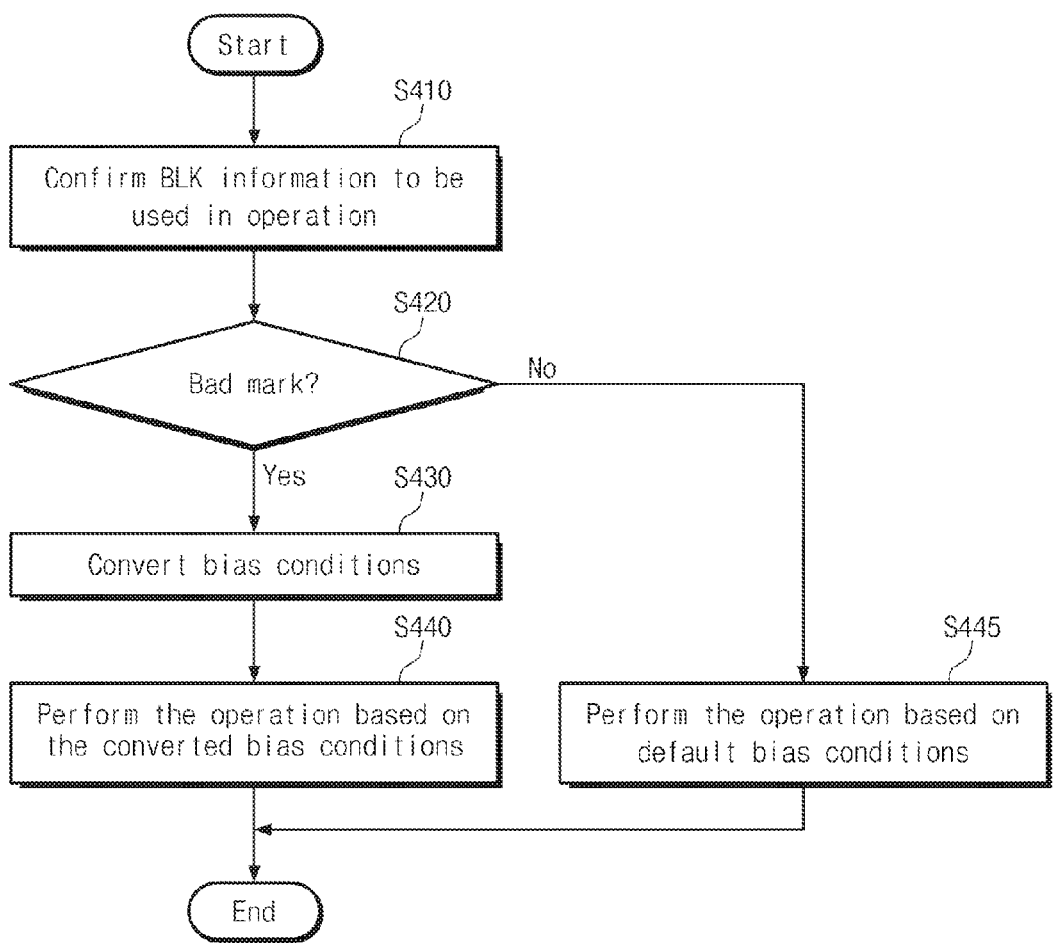
FIG. 13 is a flow chart schematically illustrating a method of driving a storage device.

FIG. 13 is a flow chart schematically illustrating a method of driving a storage device. Referring to FIGS. 1 to 13, in step S410 a memory controller 200 may check block information of a memory block to be used. In step S420, it may be determined or ascertained whether a memory block has a bad mark, based on block information. If the memory block has a bad mark, then in step S430 a bias condition for driving an element of the memory block is changed. Memory controller 200 provides nonvolatile memory device 100 with bias changing information indicating a change of a driving condition. In step S440, nonvolatile memory device 100 drives a memory block according to the changed bias condition. If the memory block does not have a bad mark, in step S445 nonvolatile memory device 100 drives the memory block according to a default bias condition.

Storage device 10 may change a bias condition of a memory block based on bad mark/clean mark information, in particular bad mark/clean mark information for the memory block.

The inventive concept may be applied to a solid state drive (SSD).

Figure 14:
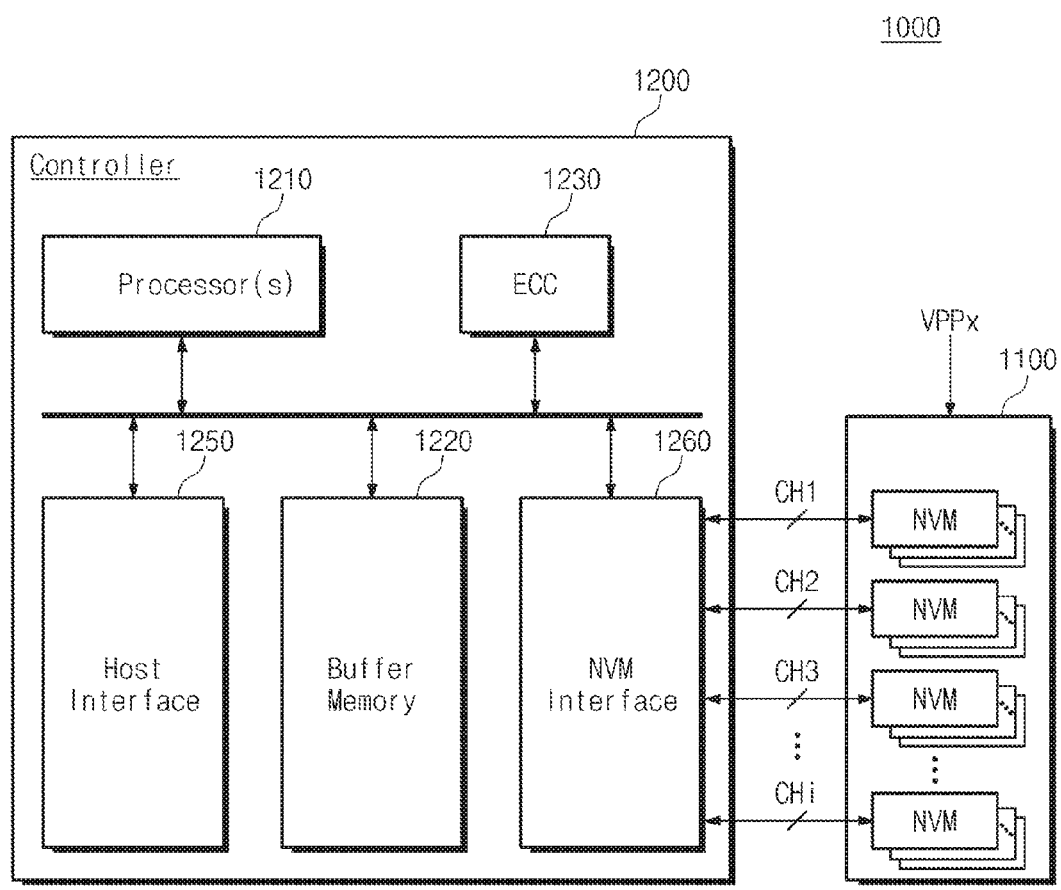
FIG. 14 is a block diagram schematically illustrating a solid state drive.

FIG. 14 is a block diagram schematically illustrating a solid state drive. Referring to FIG. 14, a solid state drive (hereinafter, referred to as SSD) 1000 includes one or more nonvolatile memory devices 1100 and an SSD controller 1200.

Nonvolatile memory devices 1100 are configured to be provided with an external high voltage VPPx optionally. Each of nonvolatile memory devices 1100 may be configured to check whether a threshold voltage of a selection transistor connected to a selection line is varied, as described with reference to FIGS. 1 to 13 above. SSD controller 1200 may be connected to nonvolatile memory devices 1100 through a plurality of channels CH1 to CHi (i being an integer of 2 or more). SSD controller 1200 may include one or more processors 1210, a buffer memory 1220, an ECC block 1230, a host interface 1250, and a nonvolatile memory interface 1260.

Buffer memory 1220 may store data needed to drive SSD controller 1200. In exemplary embodiments, buffer memory 1220 may include a plurality of memory lines each storing data or a command. Here, the plurality of memory lines may be mapped onto cache lines according to various methods.

ECC block 1230 may calculate error correction code values of data to be programmed in a writing operation and may correct an error of read data using an error correction code value in a read operation. In a data recovery operation, ECC block 1230 may correct an error of data recovered from nonvolatile memory devices 1100. Although not shown in FIG. 14, a code memory may be further included in SSD controller 1200 to store code data needed to drive SSD controller 1200. The code memory may be implemented with a nonvolatile memory device.

Host interface 1250 may provide an interface with an external device. Nonvolatile memory interface 1260 provides an interface with nonvolatile memory devices 1100.

Reliability of SSD 1000 may be improved by performing an operation of checking a threshold voltage of a selection transistor connected to a selection line.

The inventive concept may be applied to an eMMC (e.g., an embedded multimedia card, moviNAND, iNAND, etc.).

Figure 15:
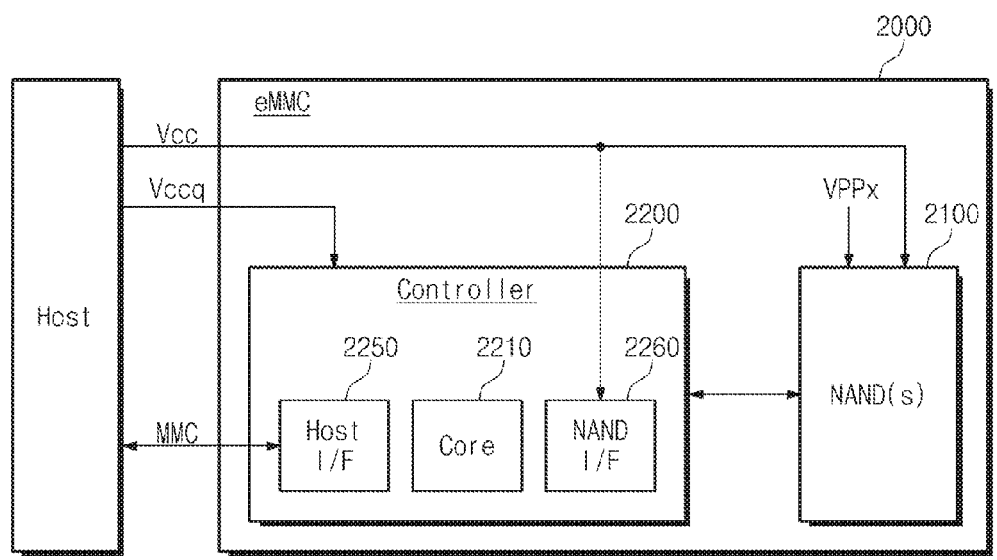
FIG. 15 is a block diagram schematically illustrating an eMMC.

FIG. 15 is a block diagram schematically illustrating an eMMC. Referring to FIG. 15, an eMMC 2000 includes one or more NAND flash memory devices 2100 and a controller 2200.

NAND flash memory device 2100 may be a single data rate (SDR) NAND flash memory device or a double data rate (DDR) NAND flash memory device. Or, NAND flash memory device 2100 may be a vertical NAND flash memory device, NAND flash memory device 2100 may be configured to check whether a threshold voltage of a selection transistor connected to a selection line is varied, as described above with respect to FIGS. 1-13. Controller 2200 is connected to NAND flash memory device 2100 via one or more channels. Controller 2200 may include one or more controller cores 2210, a host interface 2250, and a NAND interface 2260. Controller core 2210 may control an overall operation of eMMC 2000. Host interface 2250 is configured to perform an interface between controller 2210 and a host. NAND interface 2260 is configured to provide an interface between NAND flash memory device 2100 and controller 2200. In example embodiments, host interface 2250 may be a parallel interface (e.g., an MMC interface). In other example embodiments, host interface 2250 of eMMC 2000 may be a serial interface (e.g., UHS-II, UFS, etc.).

EMMC 2000 receives power supply voltages Vcc and Vccq from the host. Herein, the power supply voltage Vcc (e.g., about 3.3 V) may be supplied to NAND flash memory device 2100 and NAND interface 2260, and the power supply voltage Vccq (e.g., about 1.8 V/3.3 V) may be supplied to controller 2200. In exemplary embodiments, eMMC 2000 may be optionally supplied with an external high voltage.

Reliability of eMMC 2000 may be improved by checking a threshold voltage of a selection transistor connected to a selection line before/after an erase operation, as described above with respect to FIGS. 1-13.

The inventive concept may be applied to universal flash storage (UFS).

Figure 16:
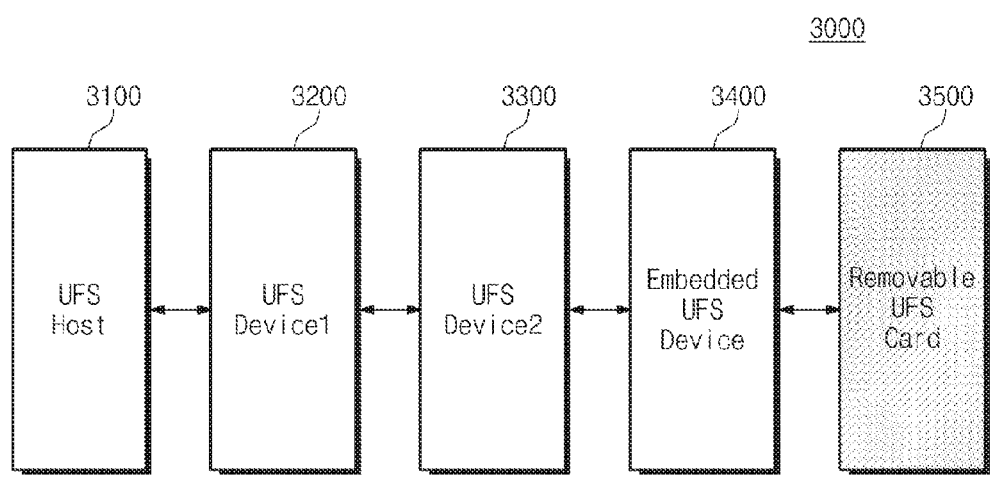
FIG. 16 is a block diagram schematically illustrating a UFS system.

FIG. 16 is a block diagram schematically illustrating a UFS system. Referring to FIG. 16, a UFS system 3000 includes a UFS host 3100, UFS devices 3200 and 3300, an embedded UFS device 3400, and a removable UFS card 3500. UFS host 3100 may be an application processor of a mobile device. Each of UFS host 3100, UFS devices 3200 and 3300, embedded UFS device 3400, and removable UFS card 3500 may communicate with external devices through the UFS protocol. At least one of UFS devices 3200 and 3300, embedded UFS device 3400, and removable UFS card 3500 may be implemented with a storage device 10 as shown in FIG. 1.

Meanwhile, embedded UFS device 3400 and removable UFS card 3500 may perform communications using protocols different from the UFS protocol. UFS host 3100 and removable UFS card 3500 may communicate through various card protocols (e.g., UFDs, MMC, SD (secure digital), mini SD, Micro SD, etc.).

The inventive concept may be applied to a mobile device.

Figure 17:
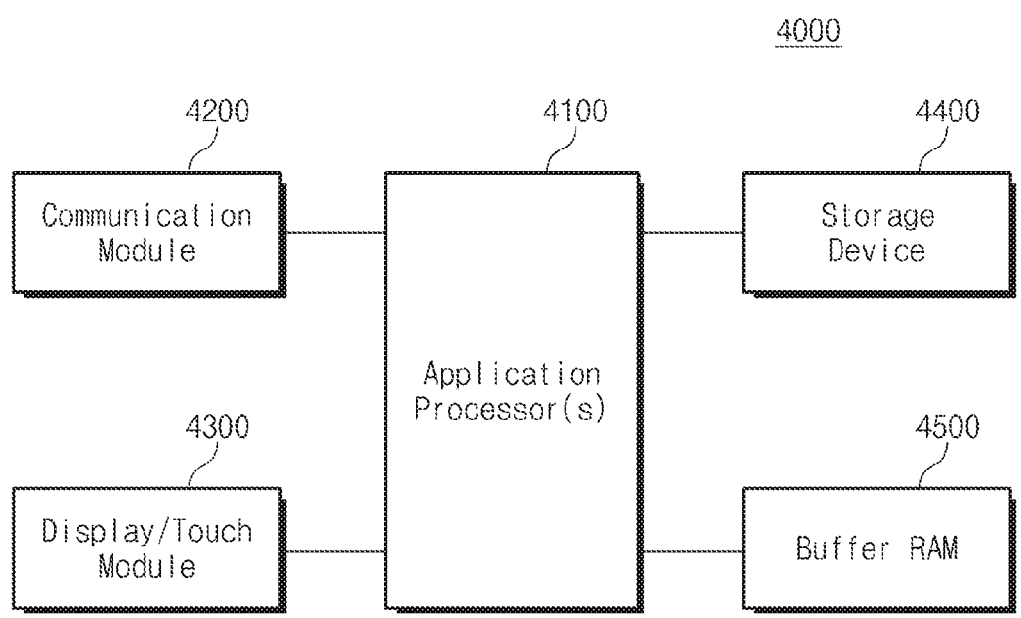
FIG. 17 is a block diagram schematically illustrating a mobile device.

FIG. 17 is a block diagram schematically illustrating a mobile device 4000. Referring to FIG. 17, mobile device 4000 includes one or more application processors 4100, a communication module 4200, a display/touch module 4300, a storage device 4400, and a buffer RAM 4500.

Application processor 4100 controls an overall operation of mobile device 4000. Communication module 4200 may be implemented to perform wireless or wired communications with an external device. Display/touch module 4300 is implemented to display data processed by application processor 4100 or to receive data through a touch panel. Storage device 4400 is implemented to store user data. Storage device 4400 may be a nonvolatile memory device that is configured to check whether a threshold voltage of a selection transistor connected to a selection line is varied, as described above with reference to FIGS. 1 to 13. Buffer RAM 4500 is configured to temporarily store data needed for a processing operation of mobile device 4000.

The performance of mobile device 4000 may be improved by including a storage device 4400 capable of improving the reliability of data.

A memory system and/or a storage device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of erasing a nonvolatile memory device which includes a plurality of memory blocks, the method comprising:
   receiving an erase command at the nonvolatile memory device;
   erasing a selected memory block among the plurality of memory blocks in response to the erase command; and
   performing an operation of checking whether a threshold voltage of a selection transistor connected to at least one selection line for selecting strings included in the selected memory block is changed while performing an erase verification operation for checking whether the selected memory block is normally erased,
   wherein an erase verification pass voltage applied to the selection transistor during the erase verification operation is less than a read pass voltage applied to the selection transistor during a read operation.

2. The method of claim 1, wherein the selected memory block is erased using an incremental step pulse erase procedure.

3. The method of claim 1, wherein each of the strings comprises at least one string selection transistor, a plurality of memory cells, and at least one ground selection transistor connected in series, and
   wherein the at least one selection line is a selection line connected to the at least one string selection transistor or the at least one ground selection transistor.

4. The method of claim 1, further comprising:
   performing an initial verification operation for checking whether a threshold voltage of the selection transistor is changed, before performing an erase operation.

5. The method of claim 1, further comprising:
   when the erase verification operation fails, assigning the selected memory block with a bad mark.

6. The method of claim 5, further comprising:
   when the erase verification operation passes, assigning the selected memory block with a clean mark.

7. A method of erasing a nonvolatile memory device which includes a plurality of memory blocks, the method comprising:
   receiving an erase command at the nonvolatile memory device;
   erasing a selected memory block among the plurality of memory blocks in response to the erase command; and
   performing an operation of checking whether a threshold voltage of a selection transistor connected to at least one selection line for selecting strings included in the selected memory block is changed while performing an erase verification operation for checking whether the selected memory block is normally erased,
   wherein a word line erase voltage is applied to word lines connected to strings of the selected memory block during an erase operation,
   wherein the word line erase voltage is applied to the word lines connected to the strings of the selected memory block during the erase verification operation, and
   wherein the word line erase voltage is greater than a ground voltage and less than a power supply voltage.

8. A method of erasing a nonvolatile memory device which includes a plurality of memory blocks, the method comprising:
   receiving an erase command at the nonvolatile memory device;
   erasing a selected memory block among the plurality of memory blocks in response to the erase command;
   performing an operation of checking whether a threshold voltage of a selection transistor connected to at least one selection line for selecting strings included in the selected memory block is changed while performing an erase verification operation for checking whether the selected memory block is normally erased; and
   performing an initial verification operation for checking whether a threshold voltage of the selection transistor is changed, before performing an erase operation,
   wherein a read pass voltage is applied to word lines connected to strings of the selected memory block during the initial verification operation and an erase verification pass voltage less than the read pass voltage is applied to the at least one selection line.

9. A storage device comprising:
   at least one nonvolatile memory device including a plurality of memory blocks each having a plurality of strings connected to a bit line, each of the strings having at least one string selection transistor, a plurality of memory cells, and at least one ground selection transistor; and a memory controller configured to control the at least one nonvolatile memory device, wherein the memory controller includes a bad mark management unit configured to control the at least one nonvolatile memory device to check whether a threshold voltage of the at least one of the string selection transistor and ground selection transistor of a selected memory block among the plurality of memory blocks is changed while performing an erase verification operation associated with an erase procedure for the selected memory block, to assign a bad mark for the selected memory block according to a result of the checking, and to store the bad mark in an assigned area of the at least one nonvolatile memory device, wherein the memory controller is configured to perform, before the erase operation is executed, an initial verification operation in which a read pass voltage which is greater than an erase verification pass voltage is applied to the selected memory block, and the erase verification read pass voltage is applied to at least one of a string selection line connected to the at least one string selection transistor and a ground selection line connected to the at least one ground selection transistor.

10. The storage device of claim 9, wherein the initial verification operation is performed based on selection line checking information transferred from the memory controller to the at least one nonvolatile memory device.

11. The storage device of claim 9, wherein a bias for operating the selected memory block is adjusted based on the bad mark.

12. A storage device comprising:

at least one nonvolatile memory device including a plurality of memory blocks each having a plurality of strings connected to a bit line, each of the strings having at least one string selection transistor, a plurality of memory cells, and at least one ground selection transistor; and a memory controller configured to control the at least one nonvolatile memory device, wherein the memory controller includes a bad mark management unit configured to control the at least one nonvolatile memory device to check whether a threshold voltage of the at least one of the string selection transistor and ground selection transistor of a selected memory block among the plurality of memory blocks is changed while performing an erase verification operation associated with an erase procedure for the selected memory block, to assign a bad mark for the selected memory block according to a result of the checking, and to store the bad mark in an assigned area of the at least one nonvolatile memory device, wherein an erase verification pass voltage applied to a string selection line connected to the at least one string selection transistor and a ground selection line connected to the at least one ground selection transistor during an erase operation is different from a read pass voltage applied to the string selection line and the ground selection line during a read operation.

\* \* \* \* \*